United States Patent [19]

Kingsley et al.

[11] Patent Number: 5,187,369
[45] Date of Patent: Feb. 16, 1993

[54] HIGH SENSITIVITY, HIGH RESOLUTION, SOLID STATE X-RAY IMAGING DEVICE WITH BARRIER LAYER

[75] Inventors: Jack D. Kingsley; Robert F. Kwasnick; Ching-Yeu Wei; Richard J. Saia, all of Schenectady, N.Y.

[73] Assignee: General Electric Company, Schenectady, N.Y.

[21] Appl. No.: 762,708

[22] Filed: Sep. 19, 1991

Related U.S. Application Data

[63] Continuation-in-part of Ser. No. 590,848, Oct. 1, 1990, abandoned.

[51] Int. Cl.$^5$ .................. G01T 1/20; G01T 1/202
[52] U.S. Cl. ................. 250/370.11; 250/370.09; 250/367
[58] Field of Search .............. 250/367, 370.08, 370.09, 250/370.11, 366, 368

[56] References Cited

U.S. PATENT DOCUMENTS

| 4,011,454 | 3/1977 | Lubowski et al. ............... 250/483.1 |
| 4,694,177 | 9/1987 | Akai .................................. 250/368 |
| 4,870,279 | 9/1989 | Cueman et al. .................. 250/368 |
| 4,906,850 | 3/1990 | Beerlage ........................ 250/370.09 |
| 4,933,042 | 6/1990 | Eichelberger et al. ........... 156/239 |
| 4,940,901 | 7/1990 | Henry et al. .................... 250/370.11 |

FOREIGN PATENT DOCUMENTS

| 0437051 | 7/1991 | European Pat. Off. . |
| 2386053 | 10/1978 | France . |
| 2471610 | 6/1981 | France . |

OTHER PUBLICATIONS

"Radiation Detection With Evaporated CSI(TI) Coupled to a-Si:H Photodiode Layers" I. Fujieda et al., vol. 219 Materials Research Society Symposium Proceedings, pp. 193-194.

Primary Examiner—Constantine Hannaher
Assistant Examiner—Edward J. Glick
Attorney, Agent, or Firm—Donald S. Ingraham; Marvin Snyder

[57] ABSTRACT

A radiation imager includes a photodetector array having topographically patterned surface features, which include support islands disposed over the active portion of one or more photodetectors in the photodetector array. A structured scintillator array having individual columnar scintillator elements is disposed in fixed relation to the photodetector array so that the individual scintillator elements are disposed on scintillator support islands. A barrier layer is disposed between the support islands and the photodetector array to minimize chemical interactions between the material forming the support island and the underlying photodetector array during the fabrication process. After the support islands have been patterned, the scintillator elements are grown by selectively depositing scintillator material on the support islands.

27 Claims, 5 Drawing Sheets

HIGH SENSITIVITY, HIGH RESOLUTION, SOLID STATE X-RAY IMAGING DEVICE WITH BARRIER LAYER

RELATED APPLICATIONS

This application is a continuation-in-part of application Ser. No. 07/590,848, filed Oct. 1, 1990 now abandoned.

FIELD OF THE INVENTION

The present invention relates to the field of radiation imaging, and more particularly to the field of solid state x-ray imagers having a scintillator array optically coupled to a photodetector array.

BACKGROUND OF THE INVENTION

A variety of techniques are presently available for obtaining x-ray images. One common technique employs an x-ray absorbing phosphor screen which emits optical radiation which exposes photographic film held adjacent to the phosphor screen. This technique offers the advantage of high resolution, but is not effective in real time because of the need to develop the photographic film to obtain a visible x-ray image.

Another imaging device is the x-ray image intensifier tube. In this device x-rays are absorbed by a fluorescent screen which emits photons that are in turn absorbed in a layer of photoelectron emitting material. This material emits electrons which are then accelerated and focused on a phosphor screen to produce a higher intensity visible image. While this system operates in real time, it suffers from the disadvantage that it produces relatively low resolution images as a result of optical scattering, imperfect electron optics, loss of sharpness in the optics coupling the image intensifier to the camera and other effects. In addition, it is bulky, fragile, expensive and requires high voltage to operate.

Lubowski et al. U.S. Pat. No. 4,011,454, issued Mar. 8, 1977 and entitled "Structured X-Ray Phosphor Screen," which is assigned to the assignee of the present invention and incorporated by reference for background purposes, discloses a modified x-ray image intensifier which provides increased resolution through the use of a structured scintillator material as the fluorescent screen. This structured scintillator screen is produced by a vacuum evaporation process in which cesium iodide (CsI) is evaporated from a source boat and deposited on a topographically structured surface to produce columnar scintillator elements. During the deposition, the structured surface is maintained at a temperature in the range of 50° C. to 150° C. The scintillator is then fired at 450° C. to 500° C. to compact the scintillator elements. This is followed by another firing at 450° C. to 500° C. to compact the scintillator. Following the final deposition, the scintillator is fired at 615° C.

In recent years, the art of electronic image processing has advanced rapidly. These advances have made computed topography (CT) machines not only feasible, but very valuable medical diagnostic tools. However, such machines are substantially larger and more expensive than typical x-ray machines and are more suitable for obtaining images of slices through the body rather than a chest x-ray type of image of the body.

There is a need for high resolution x-ray imaging systems which have an improved modulation transfer function (MTF). The modulation transfer function is the output contrast divided by the input modulation and is a function of the spatial frequency of the modulation.

Semiconductor photosensitive imaging arrays are widely available today for use in television cameras, facsimile machines and a wide variety of other applications. The device disclosed in Beerlage U.S. Pat. No. 4,906,850, issued Mar. 6, 1990, is an example of a radiographic image detecting device using a semiconductor photodetector matrix and a scintillator array. The Beerlage device discloses use of a protective layer of silicon oxide or silicon nitride disposed over the semiconductor photodetector matrix, with grooves cut to form land portions on which scintillator crystals are formed. Devices such as that disclosed by Beerlage proved problematic in that formation of uniform protective layers having both the required thickness and good optical transmission qualities to form the land portions is difficult when using silicon nitride or silicon oxide alone. Other materials, such as polyimides, can be used for protective and/or insulative layers in such a device as they exhibit good optical transmission characteristics and are readily patterned, even in thick layers. Such polymer layers present additional problems, however, as earlier-deposited layers of the polymer in a photodetector array can swell, crack, or otherwise become structurally degraded when exposed to the organic solvents necessarily present when subsequent uncured layers of polymers are deposited. These organic solvents readily leach through the desirably thin common electrode material, such as indium tin oxide, and can thereby cause structural damage to a device having an underlying polymer layer. Making the electrode thicker to resist such solvents is undesirable as it reduces the optical transparency of the electrode and increases its electrical resistance, and both of these changes adversely affect overall device performance.

There is thus a need for a readily fabricated and effective device for providing increased resolution in real time radiation imagery for x-ray images of the type typically provided on x-ray film and for an electronic signal output of the radiation image rather than optical output to facilitate electronic processing of the image data.

Accordingly, one object of the present invention is to provide an electronic output, x-ray sensing two-dimensional imaging array having high resolution. Another object of the present invention is to provide an imaging device that is readily fabricated using an organic film, such as a polymer, to form topographically patterned surface features as foundations to support individual scintillator elements disposed over a photodetector array to provide high resolution imaging signals.

SUMMARY OF THE INVENTION

In accordance with the present invention an x-ray imaging array comprises a photodetector array having topographically patterned surface features in combination with a structured scintillator array in which the scintillator array absorbs the incident x-rays and converts them to visible light which is sensed by the photodetector array. The topographically patterned surface features on the photodetector array comprise scintillator support islands which are substantially aligned with one or more photodetectors in the array. The scintillator array comprises individual, columnar-shaped scintillator elements disposed over the support islands so as to cause the luminescence generated within an individual scintillator element to be collected by its associated photodetector. A barrier layer is disposed between at least the active portion of the photodetector and the support island, and a protective covering is preferably disposed between the support island and the scintillator element. The barrier layer chemically separates the support islands from the photodetectors and preferably comprises an inorganic dielectric material which is substantially impervious to organic solvents, such as those used in the fabrication process for forming polyimide insulating layers. Silicon dioxide advantageously used to form the barrier layer.

In accordance with one embodiment, each island support structure and associated scintillator element is aligned with the active area of one of the individual photodetectors of the array. A scintillator material such as doped CsI is deposited on the support island under conditions which result in the scintillator material growing in a structured, columnar manner whereby a separate element of the structured scintillator material grows on each of the support islands. The processes for forming the imaging device do not expose the device to temperatures in excess of 250° C.

To provide response at spatial frequencies up to five line pairs per millimeter, the support islands are preferably 60 to 90 microns wide and located on 100 micron centers. The scintillator elements preferably have a height of about 150 to 450 microns so as to provide sufficient x-ray stopping power to be effective with low x-ray dosages.

The gaps between scintillator elements which space them apart may be filled with a reflective material such as titanium dioxide to improve light collection efficiency and minimize cross talk between adjacent elements.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which like characters represent like parts throughout the drawings, and in which:

DETAILED DESCRIPTION

Figure 1:
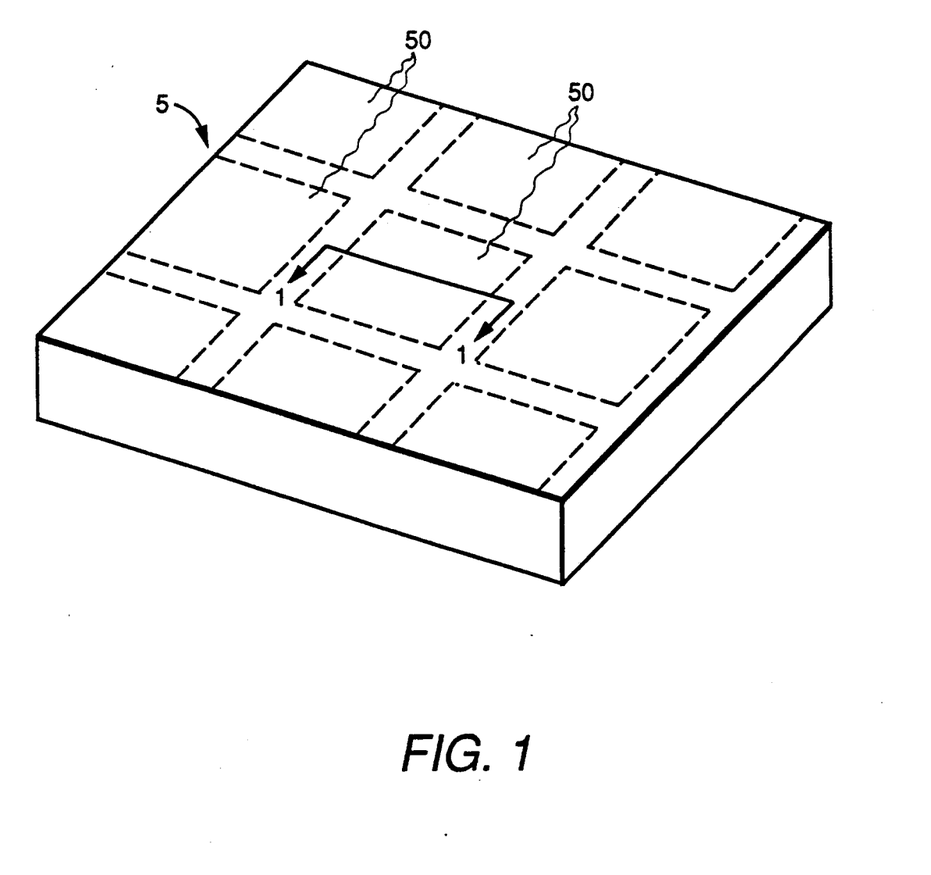
FIG. 1 is a stylized perspective view of a portion of a photodetector array in accordance with this invention.

In FIG. 1, a small portion of a photodetector array 5 of a radiation imaging device is illustrated in a stylized perspective view. Photodetector array 5 comprises a plurality of separate photodetectors 50 which are outlined in phantom. This photodetector array may preferably be one of the general type comprising thin film transistors arranged in an array of rows and columns with photodiodes disposed thereover. The thin film transistors control readout of charge from the photodiodes by connecting the gate electrodes of the thin film transistors in parallel along each row and by connecting the source or output electrode of the thin film transistors along each column. Such a photodetector array may typically have a size of from 20 cm×20 cm to 40 cm×40 cm, and individual pixels spaced on 100 to 200 micron centers. The total number of photodetectors may therefore range from about 1 million to about 17 million or more in an assembled imaging device.

Figure 2:
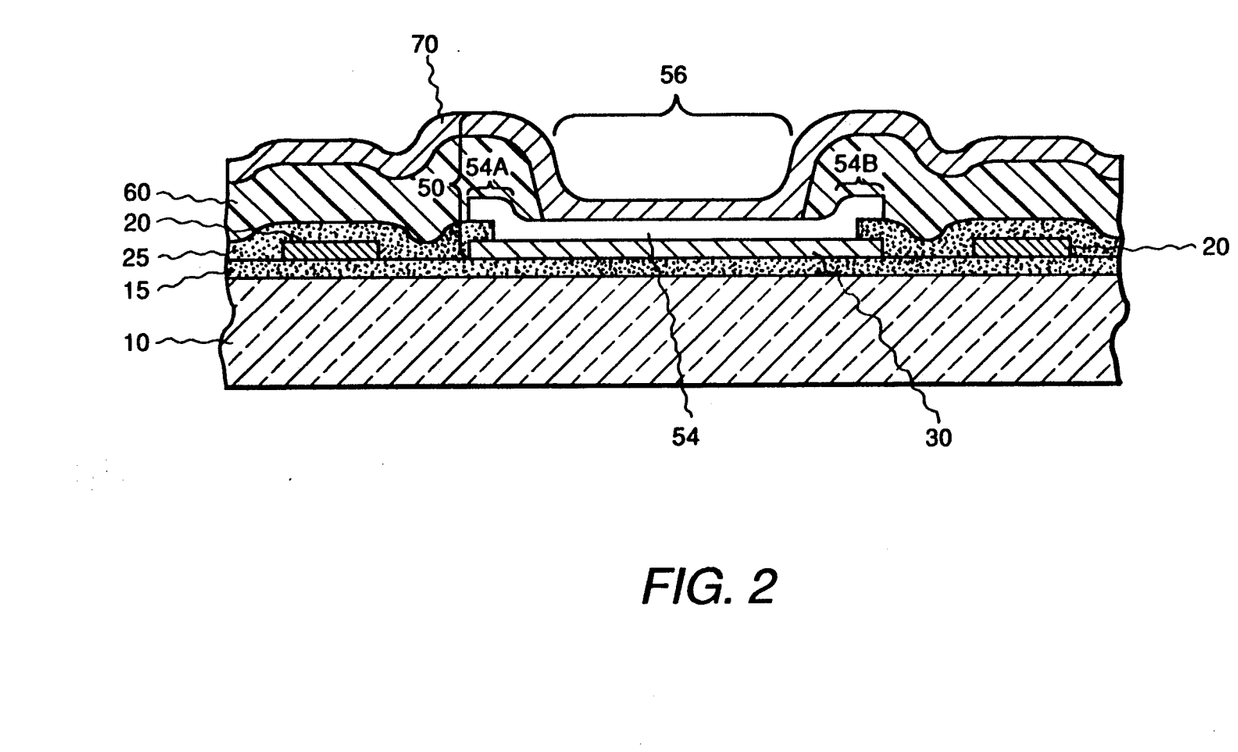
FIG. 2 is a cross-sectional view along the line 1—1 of a portion of the device illustrated in FIG. 1.

FIG. 2 is a cross-sectional view of a representative portion of photodetector array 5 comprising photodetector 50 taken along the line 1—1 in FIG. 1. As illustrated in FIG. 2, the photodetector array is disposed on a substrate 10 which is typically covered by a gate dielectric film 15. Photodetector 50 is preferably a silicon photodiode as described in greater detail below; photodetector 50 may alternatively comprise other known solid state photodetectors. An amorphous silicon photodiode typically comprises a bottom contact metallization layer 30 disposed over dielectric layer 15 so as to form a base on which the remaining components may be fabricated. Data lines 20 are also disposed on dielectric layer 15 spaced apart from contact metallization layer 30 and are typically used to connect the source (or drain) of thin film transistors (not shown), which control the readout from photodetectors 50, in columns in the array. Data lines 20 and edge portions of contact metallization layer 30 are typically covered by thin film transistor (TFT) dielectric coating layer 25, which is deposited over substantially the entire substrate as a part of the fabrication of the thin film transistors. Substrate 10 advantageously comprises glass or similar substrate materials as are known in the art and gate dielectric film 15 advantageously comprises silicon oxide, silicon nitride, or similar dielectric materials. Contact metallization layer 30 advantageously comprises molybdenum or a similar conductor exhibiting good adherence to dielectric layer 15; TFT dielectric coating layer 25 typically comprises similar materials as gate dielectric layer 15.

Photodetector 50 typically comprises a layer of photosensitive material 54 comprising hydrogenated amorphous silicon or the like disposed over and in ohmic contact with contact metallization layer 30. Photodetector dielectric layer 60 is disposed over TFT dielectric coating layer 25 and edge portions 54A, 54B of photosensitive material layer 54. Photodetector dielectric layer 60 preferably has a thickness selected to reduce the capacitance between the signal or data lines and the electrode which overlies the assembled imager. The thickness of photodetector dielectric layer 60 desirably is between about 1.0 and 2.0 microns and is reasonably uniform over all topographic features between photodetectors in the array so as to exhibit a reasonably smoothly sloped upper surface after it has been deposited over the array. Photodetector dielectric layer 60 advantageously comprises an organic dielectric film, such as polyimide, which is readily applied, provides a substantially uniform structure in such a relatively thick layer, and exhibits good dielectric characteristics.

A common electrode 70 is disposed over photodetector dielectric layer 60 and is in ohmic contact with the portion of photosensitive material layer 54 that is not covered by photodetector dielectric layer 60. Common electrode 70 advantageously comprises an optically transparent material having low electrical resistance, such as indium tin oxide or the like, and has a thickness between about 50 nm and 300 nm. The portion of the common electrode 70 overlying photosensitive material layer 54 and the photosensitive material comprise an active area 56 of photodetector 50, i.e., the area of the photodetector array on which incident light can be detected by photodetector 50 and converted to an electrical signal.

A radiation imaging device can be provided by optically coupling the photodetector array to a scintillator material which luminesces when it absorbs incident radiation such as x-rays. The device thus converts the luminescence emitted by the scintillator material into an electronic imaging signal. Although a uniform block of scintillator material could be used, that arrangement would result in low resolution because the luminescence emitted by the scintillator on the absorption of x-rays is emitted in random directions within the scintillator. This emission of luminescence in all directions within the scintillator would cause each photodetector to respond to luminescence emitted toward it from directly above it and to luminescence emitted above other nearby photodetectors in an emission direction which results in the emitted photons being absorbed within that particular photodetector. This lack of directional discrimination would result in smearing of the image so as to reduce the modulation transfer function and therefore produce an electronic image which exhibits substantially less resolution than the photodetector array itself.

In order to form a high resolution x-ray imager, it is necessary to provide a scintillator structure which substantially restricts light generated in alignment with one of the photodetectors to being collected by that photodetector. Further, in order to provide sufficient x-ray stopping power to ensure high sensitivity, most available scintillator materials must be in the neighborhood of 150 to 450 microns thick. Thus, bonding such a uniform scintillator to the photosensitive imaging array and then attempting to etch the scintillator to form individual elements aligned with the photosensitive imaging array is of questionable feasibility and would be exceedingly time consuming.

Use of a scintillator having individual scintillator elements whose structure retains any luminescence emitted therein and directs it toward an aligned photodetector in an array provides the desired structure for optimum resolution in which luminescence generated in a particular region of the scintillator is collected by the photodetector in alignment with that region. Such a structure can be produced by combining individual scintillator elements which have reflective lateral surfaces to form a scintillator array and aligning that scintillator array with the photodetector array. However, in a system having photodetectors disposed on 100 to 200 micron centers and comprising millions of pixels, assembling such as array from individual elements would be difficult, time consuming and impractical at this time.

Figure 4:
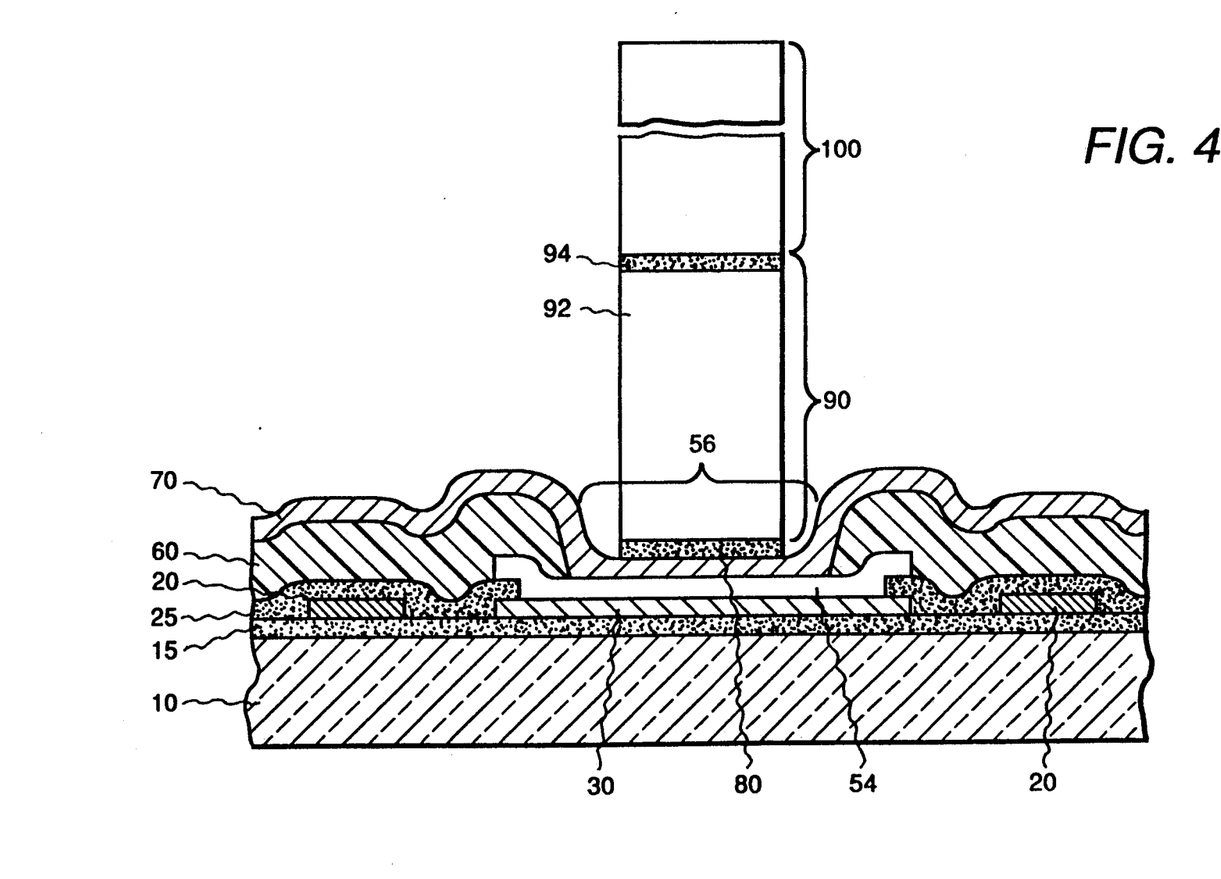
FIG. 4 is a cross-sectional view of a device constructed in accordance with one embodiment of the present invention.

Such a desired radiation imaging device structure can be assembled in accordance with this invention by providing topographically patterned surface features on the photodetector array over which the scintillator elements can be disposed. Such topographically patterned surface features comprise spaced-apart, raised scintillator support islands 90 as shown in FIG. 4 on which a structured scintillator array of the desired dimensions can be grown. To best isolate the individual scintillator elements from one another, each scintillator support island preferably has a height above the photodetector array of between about 10 to about 40 microns, adheres well to an underlying material on which it is disposed, has relatively vertical sidewalls, and is capable of being formed without adversely affecting other structures in the radiation imaging device. Organic films such as polymers, and in particular polyimides, are advantageously used in the formation of support islands as they are readily deposited in the required thickness, can be fairly easily patterned to form the desired island structure, and exhibit good structural stability during the fabrication of and use of the radiation imaging device. Application of a subsequent polyimide layer on a device already containing polyimide in its structure can present problems if the organic solvents contained within the uncured, subsequently-deposited layer come in contact with the underlying polyimide structure. Thus, application of an additional polyimide layer over photodetector array 5 (FIG. 1) as described above can adversely affect the structural integrity of photodetector dielectric layer 60, as shown in FIG. 2, in that solvents present in the uncured subsequently-deposited polyimide layer can leach through common electrode layer 70 into the underlying polyimide layer and cause it to crack, swell, dissolve, lose adhesion, or otherwise degrade in structural integrity.

Figure 3:
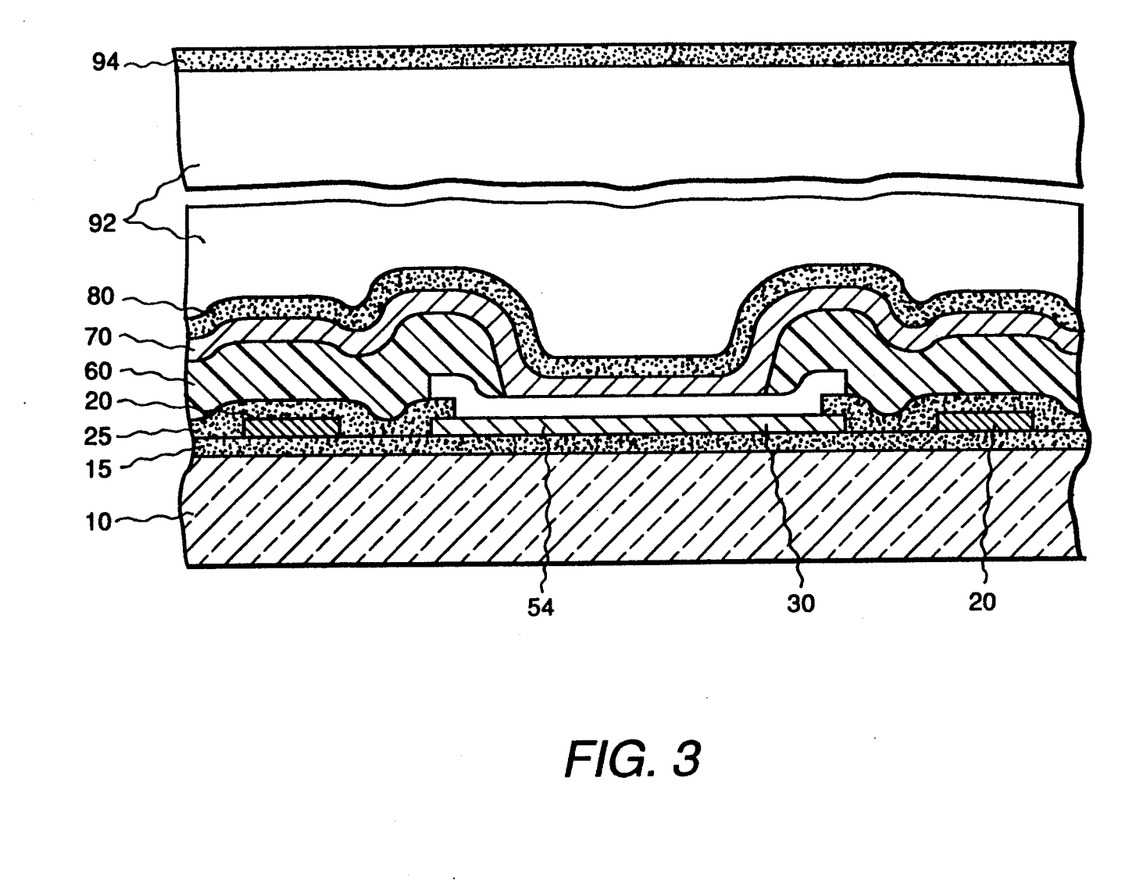
FIG. 3 is a cross-sectional view of the device of the present invention during one step of the fabrication process in accordance with one embodiment of the invention.

In accordance with this invention, a barrier layer 80 is disposed over common electrode 70, as illustrated in FIG. 3. Barrier layer 80 chemically separates the underlying photodetectors from the support island structures in that during the fabrication process the barrier layer substantially prevents chemical interaction between materials used in the formation of the island structures and the underlying photodetector array structure. The barrier layer comprises a material that is substantially impervious to organic solvents, for example an inorganic dielectric material such as silicon dioxide or the like. Barrier layer 80 advantageously is substantially optically transparent to optimize the optical transmission of the luminescence from the scintillator material, through the support island structure, to the photodetector array. Further, barrier layer 80 preferably comprises material that can be deposited at relatively low temperatures, e.g. about 250° C. or less, and that maintains structural integrity, i.e., it does not expand significantly, crack, lose adhesion or otherwise become structurally degraded, when exposed to temperatures of about 250° C. The temperature of about 250° C. is selected because the photodetectors in the array may be damaged if they are exposed to temperatures higher than that in the process of fabricating the scintillator. It is additionally preferable, but not necessary for the practice of this invention, that the barrier layer comprise a material that allows selective etching with respect to the support island material and the common electrode material; i.e. the support island can be etched with a given etchant down to but not necessarily through the barrier layer, and the barrier layer can be etched with a given etchant down to, but not through, the common electrode. The barrier layer also serves to protect the relatively thin common electrode during the patterning of the much thicker polyimide layer to form the support islands as the etching of the polyimide layer necessarily requires some overetching, even when the layer has a reasonable thickness uniformity (e.g., 5%), in order to ensure a sufficient amount of the polyimide material is removed in the regions where it is thickest. Even careful etching of the polyimide layer may result in up to about 30 nm of the indium tin oxide being removed in some portions of the common electrode.

Barrier layer 80 preferably has a thickness between about 100 and 1500 nm, and is deposited by chemical vapor deposition or similar known techniques. For example, when the barrier layer is deposited to a thickness of about 500 nm to 750 nm in a plasma enhanced chemical vapor deposition process at about 250° C. in which tetraethoxysilicate (TEOS) is used as the source of the silicon, barrier layer 80 is substantially imperviousness to organic solvents.

A polyimide layer 92 (FIG. 3) is disposed over barrier layer 80. Polyimide layer 92 is preferably deposited by spraying or spinning on a polyimide precursor such as Dupont series 2500 or Ciba-Geigy series 200 polyimide which is then cured to convert it to the polyimide while on the barrier layer 80. The thickness of polyimide layer 92 is preferably between about 10 and 40 microns. Alternatively, this polyimide layer 92 may be formed by using a preformed sheet of polyimide such as Kapton ® polyimide, available from E.I. duPont de Nemours Company in combination with an adhesive layer such as ULTEM ® polyetherimide resin available from General Electric Company by using the Ultem resin to laminate the Kapton polyimide to the barrier layer at a temperature in the range from about 220° C. to 250° C. as taught in U.S. Pat. No. 4,933,042, entitled, "Method for Packaging Integrated Circuit Chips Employing a Polymer Film Overlay Layer" by C. W. Eichelberger et al.

A protective covering layer 94 is advantageously disposed over polyimide layer 92 to minimize chemical interactions between the polyimide layer and the scintillator material to be deposited on the patterned support island structures. Protective layer 94 preferably comprises an inorganic dielectric similar to that used for barrier layer 80, such as silicon dioxide, and has a thickness between about 0.4 and 1.5 microns.

The multi-layered structure illustrated in FIG. 3 is patterned to form a plurality of island structures 90. Specifically, protective layer 94 and polyimide layer 92 are selectively etched to leave support islands 90, a representative one of which is illustrated in FIG. 4, disposed over photodetector array 5 in positions substantially aligned with active areas 56 of each respective photodetector. Known chemical etching techniques from the liquid or vapor phase or a combination thereof, as may be considered suitable, may be used to pattern the protective layer and the polyimide layer. Alternatively, laser ablation or similar patterning techniques can be used. Where the polyimide precursor is spun on as a precursor and then cured or reacted to form the polyimide, the process of removing portions of the polyimide layer to form the support islands may be simplified by etching the material before the polyimide precursor is fully cured. It is preferred to remove all of the polyimide not directly underlying the support island in order to minimize scattering of the luminescence from one element of the x-ray imaging array to another. Barrier layer 80 can be etched through similar processes as described above for the polyimide layer. As illustrated in FIG. 4, barrier layer 80 may be removed from the surface of common electrode 70 except where it underlies support island 90; alternatively, barrier layer 80 may be left substantially in place after the patterning of the support islands so long as sufficient amounts are removed at selected locations to allow necessary electrical contacts to be made to common electrode 70.

Each support island 90 is substantially aligned over the active area of one of the photodetectors in the array. For a rectangular photodetector array having its photodetectors disposed on 100 micron centers, the support islands are preferably 60 to 90 microns wide and the distance between the sidewalls of adjacent support islands is preferably 10 to 40 microns.

A presently preferred scintillator material is doped cesium iodide (CsI) which may be doped with sodium, thallium or any other appropriate dopant. Because photodetector array 5 must be maintained at temperatures below about 250° C. in order to prevent excessive deterioration, the process taught in U.S. Pat. No. 4,011,454 cannot be used directly. However, the firing steps at 450° C. to 500° C. and at 615° C. can be omitted from that process while still achieving a satisfactory scintillator array structure.

Thus, the cesium iodide scintillator material is preferably grown in the manner taught in the above-identified Lubowski et al. U.S. Pat. No. 4,011,454 while omitting the firing steps so that the photodetector array is held at temperatures below about 250° C. throughout the process. The growth is achieved by placing the photodetector array having the support islands patterned to control the growth pattern of the CsI in an evaporation deposition chamber along with an evaporation boat containing powdered cesium iodide.

The photodetector array with the associated support island structures is positioned to receive deposited material only at relatively large angles to the normal to its surface. This prevents or minimizes deposition of the CsI on portions of the array other than the support islands and results in growth of a plurality of separate scintillator elements 100 on each of respective ones of the support islands. This effect may be achieved with a baffle or other obstruction disposed between the evaporation boat and photodetector array and maintaining the walls of the evaporation chamber at elevated temperatures, or by angling the photodetector array relative to the direction of travel of the incident material. Under these conditions, the cesium iodide arrives at the photodetector array at a sufficiently large angle to the normal that it deposits essentially exclusively on the support islands 90. Because cesium iodide by nature tends to grow in a columnar configuration, proper process control enables individual scintillator elements to grow to a height of 150 to 450 microns or more without adjacent elements merging. It has been found that satisfactory scintillator elements can be obtained without employing the high temperature steps taught in the Lubowski et al. patent. In particular, the entire structure is kept below 250° C. throughout the fabrication process. As an alternative to evaporation, sputtering or chemical vapor deposition may be employed in the growth of the scintillator elements.

Figure 5:
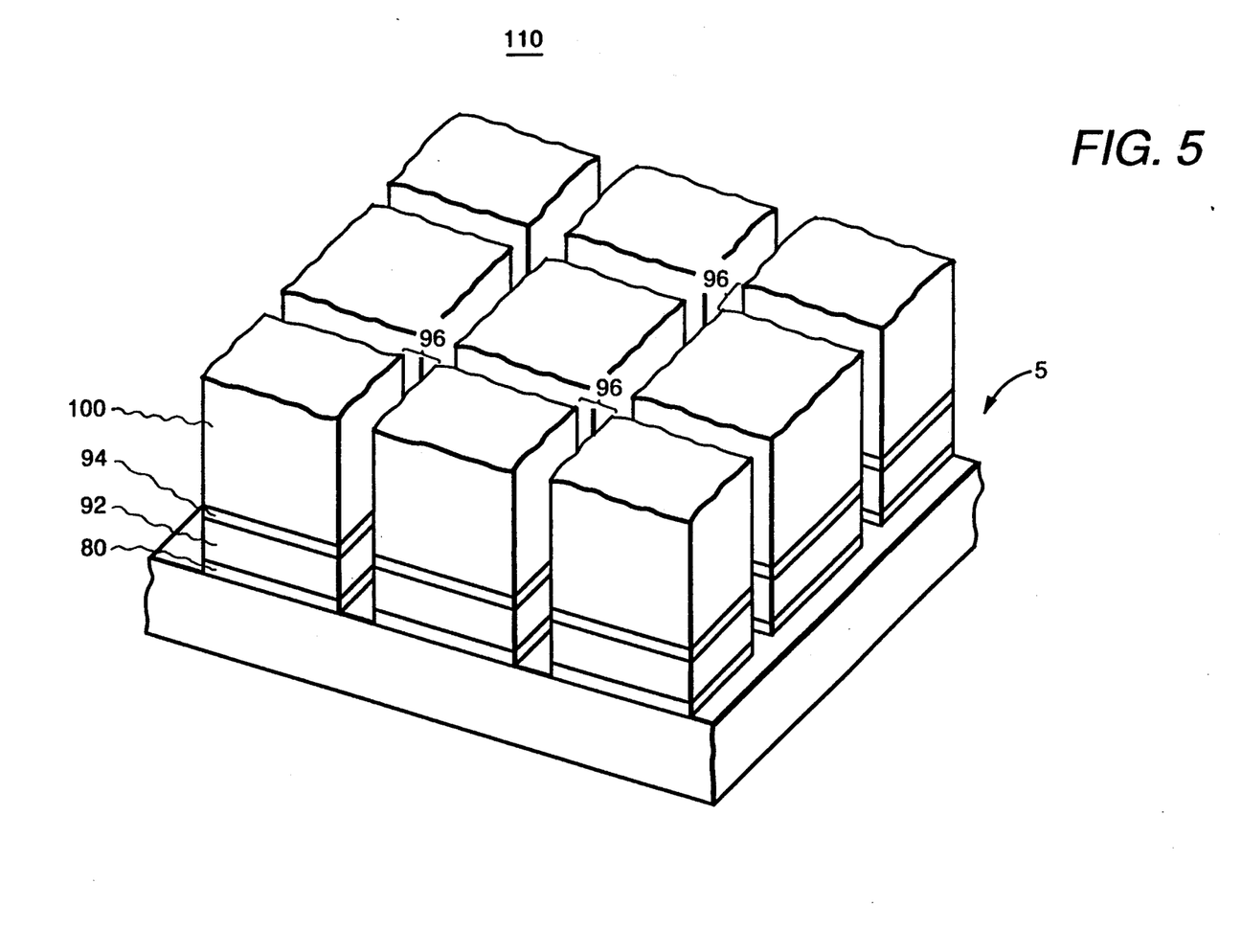
FIG. 5 is a stylized perspective view of a portion of a radiation imaging device constructed in accordance with one embodiment of the present invention.

Following the growth of structured scintillator elements 100, the generally rectangular parallelepiped configuration of the individual scintillator elements tends to trap any light which is generated therein within the individual elements with the result that most of the light generated therein is collected by the underlying photodetector. However, some light will escape from an individual element by striking its lateral surface sufficiently close to the normal that it is not totally internally reflected. Such escaping light may enter an adjacent element and be collected by its respective photodetector. Such crosstalk reduces both image resolution and contrast and is thus considered undesirable. The amount of such crosstalk may be reduced by filling the gaps 96 (FIG. 5) between the individual scintillator elements 100 with either an optical absorber or an optical reflector (not shown). Optical reflector materials include titanium dioxide, magnesium oxide and lead oxide which may be introduced as a fine powder. Gentle vibration of the scintillator structure can aid in settling this powder in the gaps between the adjacent scintillator columns.

Preferably, a reflective material is deposited over the upper end of the cesium iodide elements to reflect light which would otherwise emerge from those ends. This reflective layer may be deposited directly on the as-grown end of the cesium iodide elements or, if preferred, those elements may be gently polished beforehand to provide a more planar surface. If desired, an environmental protection layer such as a silicone potting gel and a protective x-ray window may be deposited over the entire radiation imager 110 to minimize externally induced changes in the structure.

With the fabrication of this radiation imager now complete, this imager array may be used to detect x-rays and convert them to electronic signals which may then be converted to a readout image either directly or after data reduction intended to enhance image quality or information content, as may be considered desirable. This x-ray imaging array requires only the low voltages needed to operate the photodetector array and is rugged and maintenance free.

This array has the advantage of providing high resolution because of its small cell size and ability to restrict substantially all of the luminescence generated within each cell to that same cell. It also provides the advantage of providing relatively high sensitivity because of its thick x-ray absorbing scintillator elements which are capable of absorbing a substantial portion of incident x-rays.

While doped CsI is presently preferred as the scintillator material, other scintillator material which can be provided in such a structured array may also be used. Such structured arrays may be produced by patterned growth as with CsI or by conversion of a block of scintillator material into individual elements having suitable sizes and properties by sawing, laser ablation, chemical etching or other techniques.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A radiation image comprising:
   a plurality of photodetectors arranged in an array, each of said photodetectors having an active area in which luminescence is converted to an electrical signal;
   a barrier layer disposed over said active area of each of said photodetectors, said barrier layer being substantially impervious to organic solvents;
   a plurality of scintillator support islands, each of said islands being disposed on said barrier layer to be substantially aligned with at least one active area of respective ones of said photodetectors, each of said support islands having a first end surface and a second end surface, said first end surface adjoining said barrier layer; and
   a scintillator array comprising a plurality of individual scintillator elements, each of said individual scintillator elements having a columnar configuration and being disposed on respective ones of said support islands.

2. The device of claim 1 further comprising a protective covering disposed over said second end surfaces of said scintillator support islands.

3. The device of claim 2 wherein said support island comprises an organic film and said barrier layer and said protective covering each comprise an inorganic dielectric.

4. The device of claim 3 wherein said barrier layer comprises silicon oxide.

5. The device of claim 3 wherein said scintillator support islands each comprise a polymer.

6. The device of claim 5 wherein said polymer comprises a polyimide.

7. The device of claim 3 wherein said photodetector array further comprises a photodetector dielectric layer, said dielectric layer comprising the same material as said support islands.

8. The device of claim 1 wherein said scintillator support islands comprise a material etchable by a process to which said barrier layer is substantially immune.

9. The device of claim 1 wherein said barrier layer is substantially optically transparent.

10. The device of claim 1 wherein said barrier layer comprises material that can be deposited on said photodetector array at temperatures below about 250° degrees C.

11. The device of claim 1 wherein said barrier layer comprises a material that retains its structural stability up to temperatures of about 250° degrees C.

12. The device of claim 1 wherein each of said scintillator elements has a height which is at least twice the width of the base.

13. The device of claim 1 wherein said scintillator array comprises cesium iodide.

14. The device of claim 1 wherein said barrier layer has a thickness of between about 100 and 1500 nm.

15. The device of claim 1 wherein said support islands have a thickness between said first end and second end surfaces between about 10 and 40 microns.

16. The device of claim 1 wherein each of said support islands is aligned with only one of said active areas.

17. A method of producing a radiation imager comprising:
   providing a photodetector array comprised of a plurality of photodetectors, each of said photodetectors having an active area, said photodetector array having topographically patterned surface features including spaced apart, raised support islands, the pattern of the centers of said support islands being substantially the same as the pattern of the centers of said photodetectors, the centers of said support islands being substantially aligned with the centers of respective ones of said photodetector active areas; and
   forming a structured scintillator material on said support islands, said structured scintillator material forming separate scintillator elements disposed over and in substantial alignment with said support islands;
   the step of providing a photodetector array having topographically patterned surface features including;

depositing a barrier layer comprising a material that is substantially impervious to organic solvents over said photodetectors;

depositing an organic film over said barrier layer; and patterning at least said organic film to form said spaced-apart support islands.

18. The method recited in claim 17 wherein said step of providing a photodetector array having a topographically patterned surface feature further comprises:

depositing a protective covering over said organic film; and patterning said protective covering in correspondence with said organic film.

19. The method recited in claim 17 wherein the step of forming comprises:

growing said scintillator elements on said support islands by evaporation, sputtering or chemical vapor deposition.

20. The method recited in claim 19 wherein the deposition vapor is provided by evaporation of a body of scintillator source material having the composition desired for the scintillator material.

21. The method recited in claim 17 wherein the step of depositing a barrier layer comprises plasma enhanced chemical vapor deposition of silicon dioxide using tetraethoxysilicate as the source of the silicon.

22. The method recited in claim 17 wherein:

said photodetector array is maintained at a temperature of less than 250° C. throughout the steps of depositing said barrier layer, depositing said organic film, depositing said protective covering and forming said structured scintillator material.

23. A radiation imager comprising:

a photodetector array having topographically patterned surface features, said photodetector array comprising a plurality of photodetectors and said surface features comprising spaced-apart support islands positioned over said photodetectors and a barrier layer of an inorganic dielectric material to chemically separate said support islands from said photodetectors; and a scintillator array comprised of individual scintillator elements, each of said individual scintillator elements having a columnar configuration;

said photodetector array and said scintillator array being disposed in fixed relation to each other with said scintillator elements being aligned with respective ones of said support islands.

24. The device of claim 23 wherein said topographically patterned surface features comprise an organic film.

25. The device of claim 24 wherein said surface features comprise materials that maintain their structural integrity at temperatures up to about 250° C.

26. The device of claim 25 wherein said support islands comprise a polyimide material.

27. The device of claim 23 wherein said inorganic dielectric layer is substantially impervious to organic solvents.

* * * * *